US011610867B2

(12) United States Patent
Pahlevaninezhad et al.

(10) Patent No.: US 11,610,867 B2
(45) Date of Patent: Mar. 21, 2023

(54) METHOD OF GROWING PLANTS USING LED LIGHT AND LED LIGHT SYSTEM EMPLOYING SAME

(71) Applicant: 10644137 CANADA INC., Calgary (CA)

(72) Inventors: Majid Pahlevaninezhad, Calgary (CA); Sam Scherwitz, Calgary (CA); Hamid Pahlevaninezhad, Calgary (CA)

(73) Assignee: 10644137 CANADA INC., Calgary (CA)

( * ) Notice: Subject to any disclaimer, the term of this patent is extended or adjusted under 35 U.S.C. 154(b) by 262 days.

(21) Appl. No.: 16/610,389

(22) PCT Filed: May 2, 2018

(86) PCT No.: PCT/CA2018/050522
§ 371 (c)(1),
(2) Date: Nov. 1, 2019

(87) PCT Pub. No.: WO2018/201250
PCT Pub. Date: Nov. 8, 2018

(65) Prior Publication Data
US 2020/0068810 A1 Mar. 5, 2020

Related U.S. Application Data (60) Provisional application No. 62/500,096, filed on May 2, 2017, provisional application No. 62/586,315, filed on Nov. 15, 2017.

(51) Int. Cl.
*H01L 25/075* (2006.01)
*H05B 45/20* (2020.01)
(Continued)

(52) U.S. Cl.
CPC .......... *H01L 25/0753* (2013.01); *A01G 7/045* (2013.01); *H05B 45/20* (2020.01); *H05B 47/11* (2020.01)

(58) Field of Classification Search
None
See application file for complete search history.

(56) References Cited

U.S. PATENT DOCUMENTS 4,858,377 A * 8/1989 Oglevee ................ A01G 9/247
165/223
2013/0283683 A1* 10/2013 Ringbom ................ F21V 14/02
47/58.1 LS (Continued)

FOREIGN PATENT DOCUMENTS

| CA | 2865189 A1 | 10/2013 |
| CA | 2884153 A1 | 3/2014 |
| CA | 2888618 A1 | 6/2014 |
| CA | 2971522 A1 | 7/2016 |
| WO | 2008/118080 A1 | 10/2008 |

OTHER PUBLICATIONS

International Preliminary Report on Patentability issued in corresponding Application No. PCT/CA2018/050522, dated Apr. 16, 2019.

(Continued)

*Primary Examiner* — Crystal L Hammond
(74) *Attorney, Agent, or Firm* — Chamberlain, Hrdlicka, White, Williams & Aughtry (57) ABSTRACT

A Light-Emitting Diode (LED) system for facilitating the growth of a plant includes at least one LED array having one or more LEDs for emitting colored light spectra absorbable by a plant, a light detector for detecting light reflected from the plant, and a LED light driver electrically coupled to the at least one LED array and the light detector. The LED light driver receives electrical power from a power source and drives the at least one LED array using the received electrical power; receives from the light detector a signal indica- (Continued)

tive of the reflected light spectra, and controls the at least one LED array to adjust at least one of the intensities and the spectra of the light emitted from the at least one LED array, based on the received signal.

25 Claims, 7 Drawing Sheets

(51) Int. Cl.
*H05B 47/11* (2020.01)
*A01G 7/04* (2006.01)

(56) References Cited

U.S. PATENT DOCUMENTS

| | | | |
|---|---|---|---|
| 2014/0115958 A1* | 5/2014 | Helene | A01G 9/24 47/17 |
| 2016/0000021 A1* | 1/2016 | Sugimoto | A01G 7/045 47/66.7 |
| 2017/0339839 A1* | 11/2017 | Carstensen | A01G 7/045 |
| 2020/0022318 A1* | 1/2020 | Adams | A01G 9/246 |
| 2020/0356078 A1* | 11/2020 | Edelkhani | G05B 19/4155 |

OTHER PUBLICATIONS

International Search Report issued in corresponding Application No. PCT/CA2018/050522, dated Jul. 17, 2018.
Written Opinion issued in corresponding Application No. PCT/CA2018/050522, dated Jul. 17, 2018.

* cited by examiner

METHOD OF GROWING PLANTS USING LED LIGHT AND LED LIGHT SYSTEM EMPLOYING SAME

CROSS-REFERENCE TO RELATED APPLICATIONS

This application claims the benefit of U.S. Provisional Patent Application Ser. No. 62/500,096, filed May 2, 2017, and U.S. Provisional Patent Application Ser. No. 62/586,315, filed Nov. 15, 2017, the content of each of which is incorporated herein by reference in its entirety.

FIELD OF THE DISCLOSURE

The present disclosure relates to methods and systems for growing plants using Light-Emitting Diode (LED) lights, and in particular to methods and systems for controlling LED lights to facilitate and enhance plant growth.

BACKGROUND

Light-Emitting Diodes (LEDs) are known and have been widely used in many industries, mostly as low-power light indicators. In recent years, LEDs with increased power output or increased luminous intensity have been developed and used for illumination. For example, with improved energy efficiency, safety, and reliability, LED lights are replacing other types of lights in the market such as incandescent lights, Compact Fluorescent Lamps (CFLs), and the like. As everyday lighting significantly contributes to the burden on power grids and greatly increases the overall requirements for electricity generation, the energy efficiency of LEDs will play a crucial role in future energy savings. It is likely that LEDs will dominate the lighting markets because of their superior energy efficiency.

LEDs with increased power output and/or increased luminous intensity have also been used as light sources for growing plants and the like. Such LEDs, which are sometimes called LED grow lights, provide various advantages such as producing precise wavelengths of lights, high intensity, high efficiency, and the like. LED grow lights are also advantageous for indoor plant growing as the process of growing plants can be performed in controlled environments with much less risks and other unwanted outdoor variables.

The plant growth occurs as a result of "photosynthesis" processes. As known in the art, the photosynthesis processes convert carbon dioxide ($CO_2$) into organic materials using energy from the light. Specifically, the light energy is absorbed through special proteins containing chlorophyll pigments that exist in photosynthetic cell membranes called chloroplasts. The photosynthetic cells are mainly in plant leaves.

However, chlorophyll only absorbs energy from particular parts or colors of the light spectrum. The effective spectra are across the blue and red color spectra. The green part of the light spectrum is reflected, which is why plant leaves are usually in green color. When photosynthetic cells in leaves die and the chlorophyll is degraded, other pigmented molecules in the leaves dominate light reflection while they are degraded to the point where the leaves only exhibit brown colors.

Thus, it is known that different pigments in chloroplasts absorb specific wavelengths of light to contribute to photosynthesis, and the photosynthetic efficiency or rate has strong correlation with the spectrum of illumination (see References 1 and 2).

For example, rice plants grown under blue and red illumination have higher photosynthesis efficiency than those grown under only red illumination (see Reference 3). Pea leaves grown under red LED light contain higher levels of β-carotene than those grown under blue or white LED light (see Reference 4).

Light intensity is another influential factor in photosynthesis (see References 2 and 5) due to the response of photosynthesis organisms to high-light intensity to reduce stress effects. Under red LED light, wheat seedlings accumulate chlorophyll at 100 $\mu mol\ m^{-2}\ s^{-1}$, but not at 500 $\mu mol\ m^{-2}\ s^{-1}$ (see Reference 6).

It is observed that plants usually absorb the blue light spectra during their early growth, and then increasingly absorb the red light spectra as they mature and during their blooming phase. The geometry of illumination such as the distance between the light sources and the plant, also affects the light energy that can be absorbed by the plant and the associated photosynthesis efficiency thereof. Usually, the available energy decreases at a rate proportional to the square of the distance between the light and the plant. In addition, plants are capable of sensing duration of lighting period and time, and change their growth rates accordingly.

Plant cultivation using constant illumination is neither energy efficient nor optimal for photosynthesis. As prior-art LED grow lights usually provide light for the plants without consideration for the aforementioned factors, they fail to provide appropriate color spectra with appropriate intensities at appropriate times in order to optimize the physiological processes of growing plants. Moreover, different plants require different light characteristics (for example, intensity, spectrum, time, and the like) to achieve the best growth performance. However, prior-art LED grow lights fail to adapt to the plant needs and fail to provide appropriate light characteristics.

Figure 1:
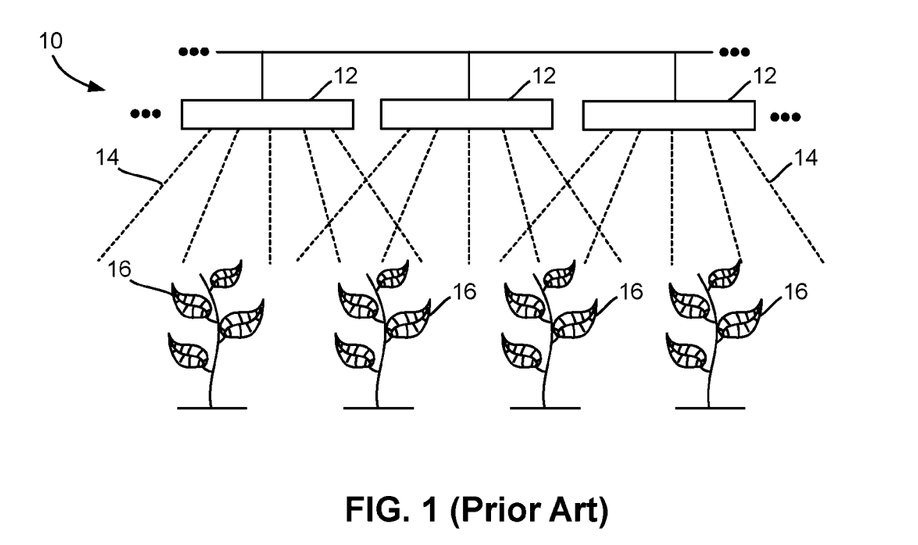
FIG. 1 is a schematic diagram of a prior-art LED grow-light system.

FIG. 1 is a block diagram of a typical prior-art LED grow-light system 10. As shown, the LED grow-light system 10 comprises a plurality of LED light sources 12 emitting light 14 towards plants 16 for facilitating their growth. The LED light sources 12 are usually located at fixed positions, for example such as mounted to the ceiling of a room.

Figure 2:
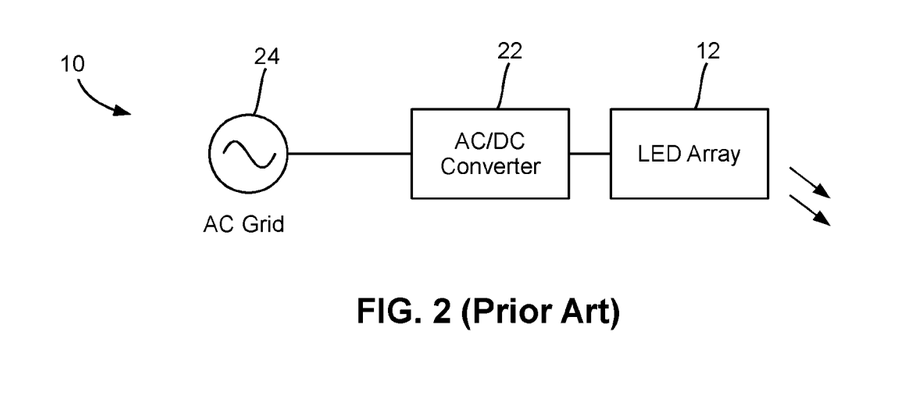
FIG. 2 is a block diagram showing the components of the prior-art LED grow-light system shown in FIG. 1.

FIG. 2 is a block diagram showing the components of the prior-art LED grow-light system 10. As shown, the LED grow-light system 10 comprises an Alternate Current (AC) to Direct Current (DC) converter (AC/DC converter) 22 for converting the AC power from an AC power source 24 such as an AC grid, to a DC power, and using the DC power to drive the LED arrays 12.

There are various challenges and difficulties related to the prior-art LED grow-light systems. For example, plants require specific types of light spectra for specific periods of time throughout their growth process. However, prior-art LED grow-light systems do not provide light configurations that are best suitable for plant growth.

As another example, the power architecture of prior-art LED grow-light systems is not optimal for highly efficient operations as they usually require large heat-sinks for achieving an effective thermal performance and safe operations.

As yet another example, the LED arrays used in prior-art LED grow-light systems are often unable to provide adequate light intensity of the light spectra required for optimal plant growth performance. Therefore, the LED grow-light systems are usually energy inefficient with significant energy wasted in the form of heat.

As still another example, in prior-art LED grow-light systems, LED light sources are usually mounted at fixed positions. Therefore, the prior-art LED grow-light systems usually do not have the capability for optimizing the distances between the LED light sources and the plants at different stages of their growth.

Due to the aforementioned challenges, prior-art LED grow-light systems cannot provide optimal solutions for facilitating plant growth. Since plant growth is a relatively lengthy process, un-optimized growth light systems significantly increase the operation cost and overall inefficiency of the systems.

Systems for optimizing photosynthesis are also known. However, these systems do not take into account all illumination parameters in photosynthesis optimization; see References 2, 5, 10 to 12). Some of the photosynthesis optimization systems focus only on the wavelength of the illumination (see Reference 11), and others focus only on the amplitude of the illumination (see Reference 12). There is some prior art that considers more than one aspect of illumination (see References 2, 5, and 10).

Photosynthetic efficiency strongly depends on all illumination parameters. Moreover, the effects of illumination parameters on photosynthetic efficiency are interrelated (that is, they are not independent from each other). However, none of the prior-art photosynthesis optimization systems takes into account all aspects of illumination.

SUMMARY

According to one aspect, there is disclosed a light system using Light-Emitting Diode (LED) and/or quantum-dot LED (QLED) light sources for facilitating and optimizing the growth of a plant. The light system comprises at least: (i) one LED array having one or more LEDs for emitting different types and ranges of intensities of light spectra absorbable by a plant, (ii) a light detector for detecting light reflected from the plant, and (iii) a LED light driver electrically coupled to the at least one LED array. The light detector receives: (i) electrical power from a power source and drives the at least one LED array using the received electrical power, (ii) receives a signal from the light detector that is indicative of the reflected light, and (iii) controls, based on the received signal, the at least one LED array to adjust at least one of the intensity and the spectrum of the light emitted from the at least one LED array.

In some embodiments, the light system further comprises at least one motor for adjusting the distance and/or angle between each of the at least one LED array and the plant. The LED light driver is electrically coupled to the at least one motor for adjusting the distance and/or angle between each of the at least one LED array and the plant, based on the received signal.

According to another aspect, there are disclosed apparatuses, methods, and systems using artificial intelligence to optimize photosynthesis.

According to another aspect, there is disclosed an intelligent system that can learn how to obtain a customized "illumination recipe" that can enable both energy and photosynthesis-efficient plant cultivation. Such a customized "illumination recipe" may include customization of the wavelength, level, geometry, and duration of illumination for cultivation of a specific plant type.

Chlorophyll fluorescence measurement is an established technique to estimate reliably the photosynthesis efficiency (see References 7 to 9). As is known, the optical energy absorbed by chlorophyll is used by the plant for photosynthesis and meanwhile, a portion thereof is turned into heat and re-emitted fluorescence at wavelengths different from that of excitation wavelengths. The conservation of energy links these processes' yields. Therefore, the chlorophyll fluorescence may be measured for indirectly estimating the photosynthesis efficiency and for generating a feedback signal to optimize the photosynthesis efficiency.

In some embodiments, the apparatus, system and method disclosed herein employ artificial intelligence to optimize illumination profiles for efficient photosynthesis in cultivation of different plants. Chlorophyll fluorescence measurements are used to estimate the photosynthesis efficiency which is the target to be optimized.

It is well known that photosynthesis efficiency or rate strongly depends on the illumination condition. Generally, there are four parameters or variables involved in the illumination including spectrum, level, geometry, and duration. Constituent photosynthesis systems vary from plants to plants, and thus the illumination conditions for plants' photosynthesis-efficient cultivation shall be adaptive thereto.

Accordingly in some embodiments, the apparatus, system and method disclosed herein comprise a learning process for determining an "illumination recipe" that may lead to the most efficient photosynthesis rate.

In some embodiments, the apparatus, system and methods disclosed herein comprise an optimization algorithm for varying the illumination condition based on photosynthesis measurements for optimization of the photosynthesis efficiency. In some embodiments, chlorophyll fluorescence measurements may be used to reliably estimate the photosynthesis efficiency and to generate inputs to the optimization algorithm.

In some embodiments, advanced optimization methods such as simulated annealing or genetic algorithms are used to find global maximum of photosynthesis efficiency as a function of parameters such as illumination spectrum, level, geometry, duration, and the like. An array of efficient light sources such as LEDs or QLEDs are mounted on movable stages. The light sources emit light waves in a spectrum range spanning from ultraviolet light to infrared light and are controlled according to the optimization results for driving photosynthesis with a specific "illumination recipe".

According to one aspect of this disclosure, there is provided a lighting system for facilitating the growth of a plant. The system comprises an illumination source for emitting a first light absorbable by the plant, said first light having a spectrum and a set of adjustable illumination parameters; at least one light detector for detecting a second light from the plant; and a control structure coupled to the illumination source and the at least one light detector. The control structure is configured for receiving from the at least one light detector, a signal indicative of the detected second light; determining a growth condition of the plant based on the received signal; determining a set of values for the set of adjustable illumination parameters based on the determined growth condition; and controlling the illumination source to adjust the set of adjustable illumination parameters using the set of determined values for facilitating the growth of the plant.

In some embodiments, the set of adjustable illumination parameters comprise at least one of the spectrum of the first light, and an intensity distribution of the first light over the spectrum.

In some embodiments, the spectrum is a spectrum spanning from an ultraviolet (UV) wavelength through a visible wavelength range to an infrared (IR) wavelength.

In some embodiments, the spectrum comprises a combination of spectra from a red-light wavelength range, a green-light wavelength range, and a blue-light wavelength range.

In some embodiments, the set of adjustable illumination parameters further comprise at least one of a distance and an angle between the illumination source and the plant.

In some embodiments, the lighting system further comprises at least one motor engaging the illumination source; wherein said determining the set of values for the set of adjustable illumination parameters based on the determined growth condition comprises determining at least one of a distance value and an angle value between the illumination source and the plant; and wherein said controlling the illumination source to adjust the set of adjustable illumination parameters using the set of determined values comprises controlling the at least one motor to adjust the at least one of the distance and the angle using the at least one of the distance value and the angle value.

In some embodiments, the second light is a light reflected from the plant.

In some embodiments, the second light is a chlorophyll fluorescence emitted from the plant; and wherein the growth condition is a photosynthesis efficiency of the plant under the first light.

In some embodiments, said determining the set of values for the set of adjustable illumination parameters based on the determined growth condition comprises determining the set of values for the set of adjustable illumination parameters for maximizing the photosynthesis efficiency by using a simulated annealing method or a genetic algorithm.

In some embodiments, said determining the growth condition of the plant based on the received signal comprises determining chlorophyll fluorescence measurements based on the received signal; and said determining the set of values for the set of adjustable illumination parameters for maximizing the photosynthesis efficiency by using a simulated annealing method or a genetic algorithm comprises:

(1) defining a plurality of states of illumination wherein each state corresponds to a set of values for the set of illumination parameters that determine the photosynthesis efficiency of the plant;

(2) setting (i) a previous-state variable $S_p$ to an initial state of illumination $S_0$, (ii) a corresponding previous-state photosynthesis efficiency $E_p$ to zero, (iii) a global time-varying parameter T to an initial value, and (iv) a current-state variable $S_c$ to a random state $S_r$ of the plurality of states of illumination that has continued for a period of time such that photosynthesis is established;

(3) calculating a current-state photosynthesis efficiency $E_c$ of the plant at the current state $S_c$ using the determined chlorophyll fluorescence measurements;

(4) comparing the current-state photosynthesis efficiency $E_c$ with the previous-state photosynthesis efficiency $E_p$;

if the current-state photosynthesis efficiency $E_c$ is less than or equal to the previous-state photosynthesis efficiency $E_p$, (5) setting the previous state $S_p$ as the current state of illumination $S_c$ and updating the current state $S_c$ to a neighboring state from $S_c$ by a random change $\Delta S$, and looping to step (3);

if the current-state photosynthesis efficiency $E_c$ is greater than the previous-state photosynthesis efficiency $E_p$, (6) calculating an acceptance probability function $\exp(-(E_c-E_p)/T)$ and checking if the acceptance probability function $\exp(-(E_c-E_p)/T)$ is smaller than a predetermined threshold $E_{min}$;

if the acceptance probability function $\exp(-(E_c-E_p)/T)$ is larger than or equal to the predetermined threshold $E_{min}$, (7) reducing the parameter T and looping to step (5); and if the acceptance probability function $\exp(-(E_c-E_p)/T)$ is smaller than the predetermined threshold $E_{min}$, (8) determining the set of values for the set of adjustable illumination parameters as the set of illumination parameters corresponding to the state $S_c$.

In some embodiments, the illumination source comprises a plurality sets of LEDs for emitting the first light.

In some embodiments, the plurality sets of LEDs comprises one or more quantum-dot LEDs.

In some embodiments, said controlling the illumination source to adjust the set of adjustable illumination parameters using the set of determined values for facilitating the growth of the plant comprises adjusting at least one of a distance and an angle of each sets of LEDs to the plant.

In some embodiments, each set of LEDs comprises one or more subsets of LEDs, each subset of LEDs configured for emitting a colored light, said colored light being a portion of the first light having a subset of the spectrum of the first light; and one or more switching components each controlling the on/off of one subset of LEDs.

In some embodiments, each switching component is configured for controlling the corresponding subset of LEDs for emitting pulsed light as the portion of the first light.

In some embodiments, the first light is a pulse-width modulated light.

In some embodiments, said determining the set of values for the set of adjustable illumination parameters based on the determined growth condition comprises determining the on/off settings of each switching component based on the determined growth condition; and said controlling the illumination source to adjust the set of adjustable illumination parameters using the set of determined values for facilitating the growth of the plant comprises controlling the switching components based on the determined on/off settings to adjust at least one of the spectrum of the first light and the intensity of the first light over the spectrum thereof.

In some embodiments, the lighting system further comprises at least one lighting and sensing device. Each lighting and sensing device comprises a housing; one of the at least one light detector received in the housing; and a group of the LEDs distributed in an annulus between the housing and the optical sensor.

In some embodiments, the at least one light detector comprises at least a lens, a light filter, and a light-sensing component.

According to one aspect of this disclosure, there is provided a method for facilitating the growth of a plant. The method comprises emitting a first light from an illumination source towards the plant, said first light having a spectrum absorbable by the plant and a set of adjustable illumination parameters; detecting a second light from the plant; determining a growth condition of the plant based on the detected second light; determining a set of values for the set of adjustable illumination parameters based on the determined growth condition; and controlling the illumination source to adjust the set of adjustable illumination parameters using the set of determined values for facilitating the growth of the plant.

BRIEF DESCRIPTION OF THE DRAWINGS

The embodiments of the present disclosure will now be described with reference to the following figures, in which identical reference numerals in different figures indicate identical elements and in which.

DETAILED DESCRIPTION

Herein, embodiments of a light system are disclosed. In some embodiments, the light system is a system using Light-Emitting Diode (LED) and/or quantum-dot LED (QLED) light sources. In some embodiments, the light system is a LED and/or QLED grow-light system emitting modulated light spectra from LED/QLED sources for facilitating the growth of plants.

In some embodiments, the light system disclosed herein comprises one or more LEDs and/or QLEDs that are powered and controlled by a LED driver. The light system also comprises a real-time monitoring sub-system for measuring and quantifying the growth of plants. Based on the real-time plant-growth measurement and quantification obtained from the real-time monitoring sub-system, the LED driver precisely controls the light spectra and intensities for facilitating plant growth. Thus, the light system disclosed herein is a closed-loop feedback system capable of optimizing the light output based on real-time plant-growth measurements. Moreover, in some embodiments, the distances between the LED light sources and the plants can be automatically adjusted based on the real-time plant-growth measurements and quantification obtained from the real-time monitoring sub-system.

Therefore, in some embodiments, the light system disclosed herein provides a nearly optimal solution for facilitating plant growth using LED lights.

Figure 3:
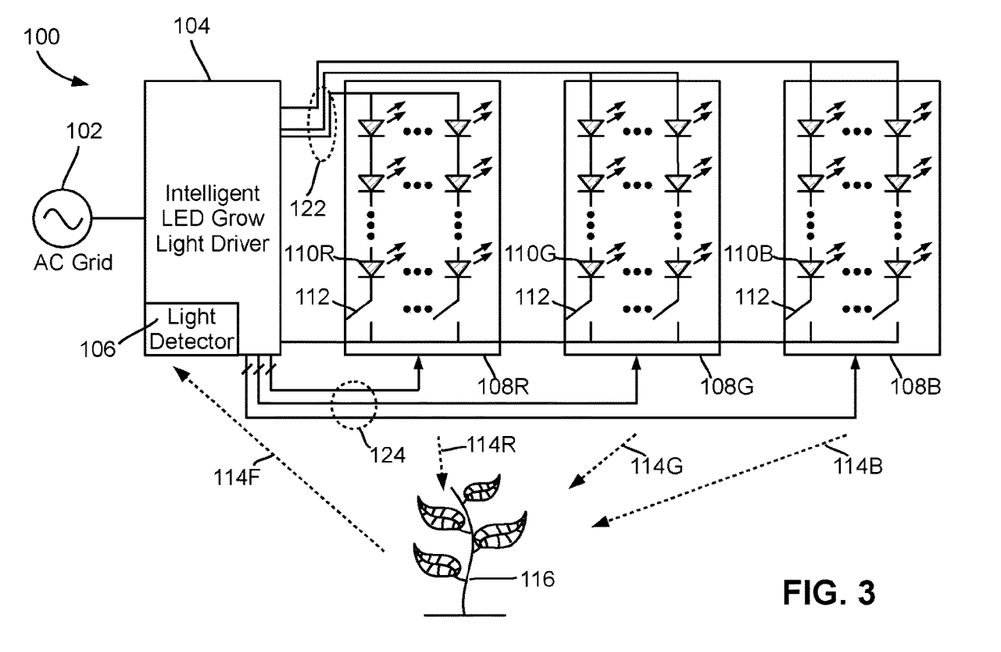
FIG. 3 is a schematic diagram of a LED grow-light system, according to some embodiments of this disclosure.

Turning now to FIG. 3, a LED grow-light system in some embodiments of this disclosure is shown and is generally identified using the reference numeral 100. The LED grow-light system 100 comprises a power source 102, an intelligent LED grow-light driver 104, a real-time monitoring sub-system 106 in the form of one or more light detectors, and three LED arrays 108R, 108G and 108B for emitting red, green, and blue light spectra 114R, 114G, and 114B towards plants 116, respectively. Each of the red, green, and blue light forms a portion of the light emitted towards the plant 116, and has a subset of the spectrum thereof. Hereinafter, the reference numerals related to light spectra may be used with a suffix "R", "G" or "B" for referring to red, green, or blue spectra, or may be used without any suffix for collectively referring to the referred component. For example, the LED arrays may be referred individually using reference numerals 108R, 108G and 108B, and may be collectively referred using reference numeral 108 for ease of description.

In these embodiments, the power source 102 is an Alternate Current (AC) power source such as an AC grid. The LED grow-light driver 104 receives AC power from the power source 102, and converts the received AC power to a DC power for individually driving the LED arrays 108R, 108G and 108B via respective power buses 122. The LED grow-light driver 104 also controls the light characteristics of the LED arrays 108R, 108G, and 108B via a set of signal lines 124.

Each LED array 108 comprises one or more columns with each column comprising one or more color LEDs 110 and a switch 112, such as a semiconductor switch, connected in series. The LEDs 110 in each LED array 108 emit light of a particular spectrum.

Figure 4:
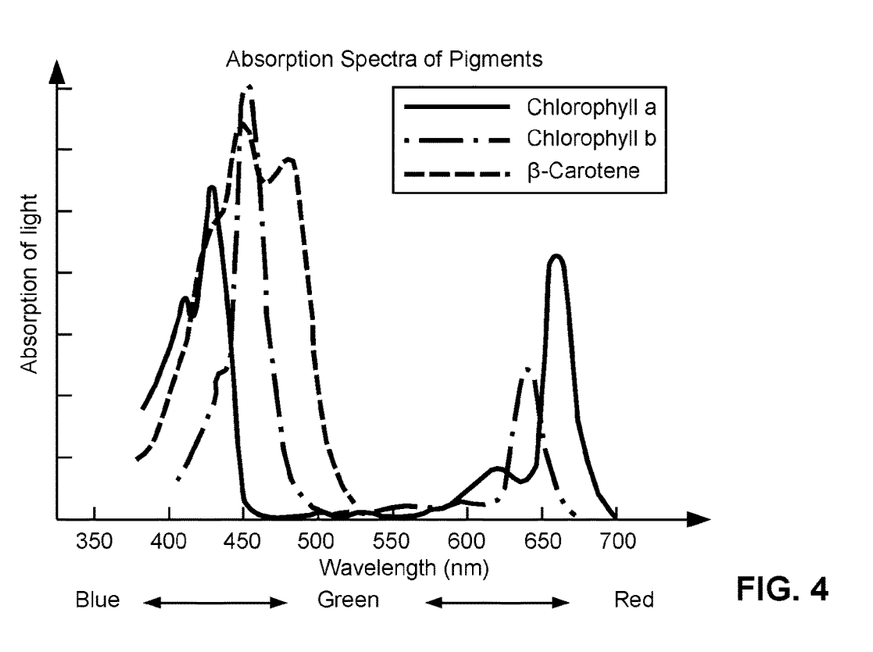
FIG. 4 shows the absorption spectra of three photosynthesis pigments.

As is known in the art, there exist a plurality of key pigments in photosynthesis such as chlorophyll a, chlorophyll b, and β-carotene that absorb light of different spectra. FIG. 4 shows the absorption spectra of the three photosynthesis pigments. As can be seen, chlorophyll a and chlorophyll b mainly absorb blue and red spectra, and β-carotene mainly absorbs blue and green spectra.

Referring back to FIG. 3, each LED array 108 emits a colored light with a spectrum about one or more light absorption peaks of the photosynthesis pigments. For example, in some embodiments, the LEDs 110R of the LED array 108R emit red light with spectra within the range between about 400 nanometers (nm) and about 470 nm, the LEDs 110G of the LED array 108G emit green light with spectra within the range between about 470 nm and about 520 nm, and the LEDs 110B of the LED array 108B emit blue light with spectra within the range between about 620 nm and about 680 nm. In some embodiments, the green-light LED array 108G comprises fewer LEDs 110G than each of the red-light and the blue-light LED arrays 108R and 108B since the main light spectrum required by plants is usually around red and blue spectra.

The LED grow-light driver 104 powers each LED array 108 through a separate power bus 122. In each LED array 108, the switch 112 in each column thereof may be controlled by the LED grow-light driver 104 to turn on or off for adjusting the light intensity thereof. The light detector 106 monitors the light 114F reflected from the plants 116. As known in the art, the spectra of the reflected light 114F provides information related to the growth of the plants 116 and the health condition thereof. Therefore, by monitoring the reflected light 114F, the light detector 106 can provide feedback signal to the LED grow-light driver 104 to measure the growth of plants 116 and to control the LED arrays 108 accordingly.

Figure 5:
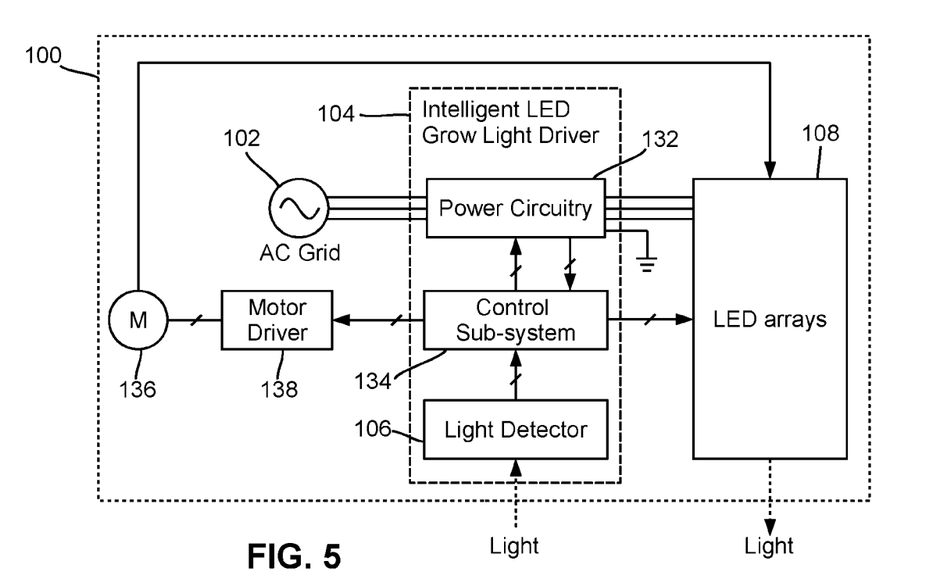
FIG. 5 is a schematic diagram showing the detail of the LED grow-light system shown in FIG. 3.

FIG. 5 is a schematic diagram showing the function structure of the LED grow-light system 100. As shown, the LED grow-light driver 104 comprises a power circuitry 132, a control structure or control sub-system 134, and a light detector 106.

The power circuitry 132 of the LED grow-light driver 104 supplies power to the LED arrays 108. In particular, the power circuitry 132 receives power from the AC grid 102, and converts the received AC power to DC power at one or more DC voltages suitable for driving the LEDs 110 of the LED arrays 108.

The control sub-system 134 of the LED grow-light driver 104 performs multiple tasks. Specifically, the control sub-system 134 controls the power circuitry 132 such that the appropriate power conversion is performed and the LEDs 110 are supplied with suitable voltages/currents.

The control sub-system 134 also dynamically adjusts the light spectra and intensities based on the structure of the LED arrays 108 to facilitate the plant growth. Specifically, the control sub-system 134 receives from the light detector 106 a signal indicative of the information of the reflected light spectra and, based on the information received and the structure of the LED arrays 108, controls the on/off of the semiconductor switches 112 in each column of the LED arrays 108 to dynamically adjust the light spectra and their intensities.

In these embodiments, the LED grow-light system 100 also comprises one or more motors 136 controlled by a motor driver 138 under the instruction of the control sub-system 134 for dynamically adjusting the distance and/or angle between each LED array 108 and the plants 116 (denoted "LED-plant distances/angles" hereinafter) based on the information received from the light detector 106 and the structure of the LED arrays 108.

Figure 6:
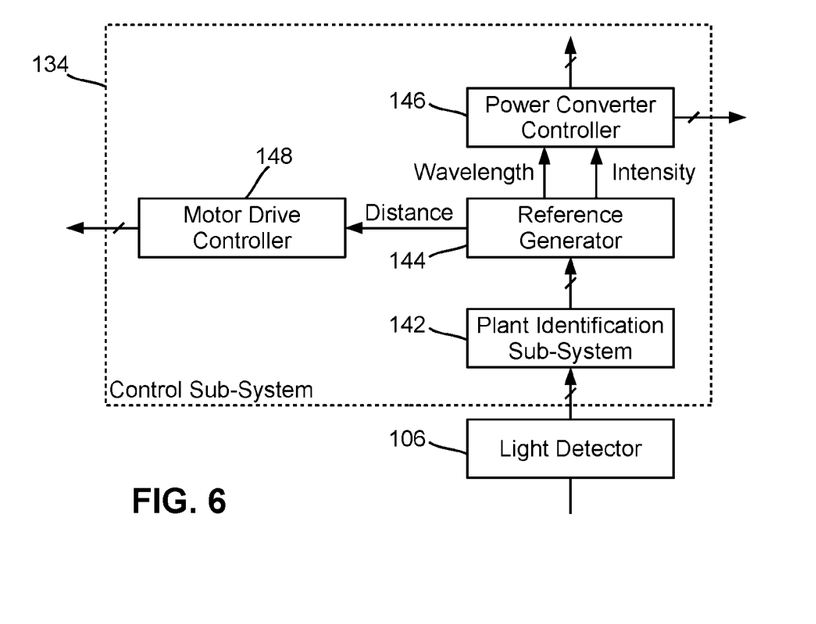
FIG. 6 is a schematic diagram showing the detail of a control sub-system of the LED grow-light system shown in FIG. 3.

FIG. 6 shows the detail of the control sub-system 134. As shown, the control sub-system 134 comprises a plant identification sub-system 142, a reference generator 144, a power converter controller 146, and a motor drive controller 148. The plant identification sub-system 142 receives a feedback signal from the light detector 106, and obtains therefrom various information related to the growth process of the plants 116. Specifically, the plant identification sub-system 142 receives the feedback signal from the light detector 106 carrying the information of the reflected light spectra, and processes the received feedback signal to obtain information related to the growth of the plants 116. Thus, the plant identification sub-system 142 quantifies the plant growth based on the information of the reflected light spectra, and produces appropriate signals for the reference generator 144. The reference generator 144 receives the signals from the plant identification sub-system 142 and generates appropriate reference signals regarding the light intensity, light wavelength, the optimal LED-plant distances/angles, and the like for controlling the power converter controller 146 and the motor driver controller 148.

The reference signals regarding the light intensities and the light wavelengths are received by the power converter controller 146, which then controls the power circuitry 132 and the switch 112 in each column of the LED arrays 108 such that proper light intensities and precise light spectra are applied to the plants 116. The motor driver controller 148 receives the calculated LED-plant distances/angles and adjusts the LED arrays 108 accordingly. Thus, the control sub-system 134 ensures that the emitted LED light is of optimal light intensity, light spectrum, and LED-plant distances/angles for optimizing the growth process of the plants 116.

Figure 7:
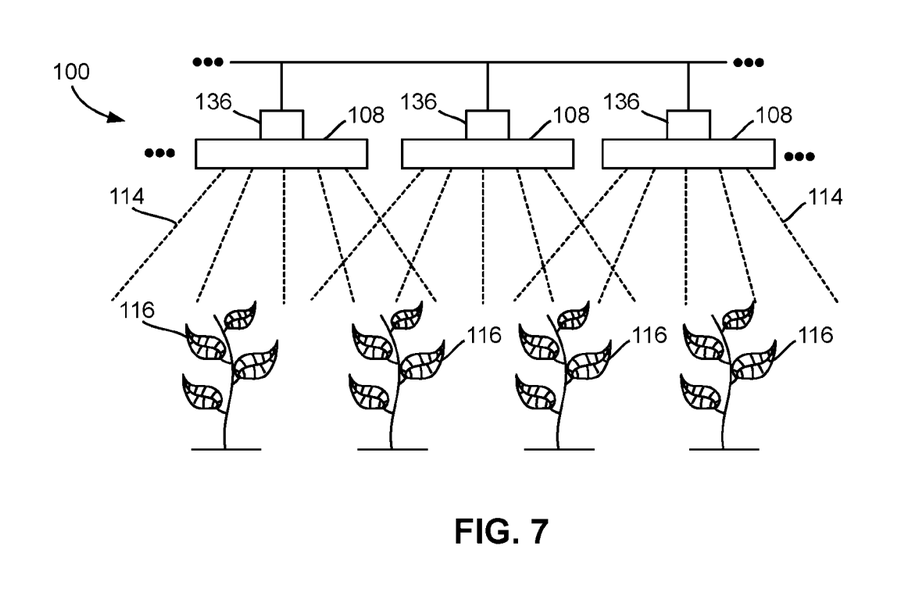
FIG. 7 is a schematic diagram of the LED grow-light system shown in FIG. 3, illustrating the mechanism for adjusting the distances and/or angles between the LED arrays of the LED grow-light system and the plants.

FIG. 7 is a schematic diagram showing the mechanism for adjusting the distance between the LED arrays 108 and the plants 116. As shown, each LED array 108 is associated with a motor 136. The LED grow-light driver (not shown) ultimately controls each motor 136 to move the respective LED array 108 forward/backward, and/or to adjust the angle of the respective LED array 108 with respect to the plants 116. The desired distance and/or angle is determined based on the required light intensity, and the condition of the plant 116 determined by the plant identification sub-system 142 (see FIG. 6). The light intensity is generally proportional to the inverse of the square value of the distance. Thus, the distance has a significant impact on the growth of the plant 116. The LED grow-light system 100 is able to adjust the distance and/or angle to an optimal value, which not only accelerates the growth of plant 116 but also significantly decreases the operation cost by decreasing the amount of electricity needed during the growth process. Moreover, as different light intensities may be required for different plants, the capability to adjust and optimize distances/angles allows the LED grow-light system 100 to be used in various plant growing applications for facilitating the growth of various types of plants.

Figure 8:
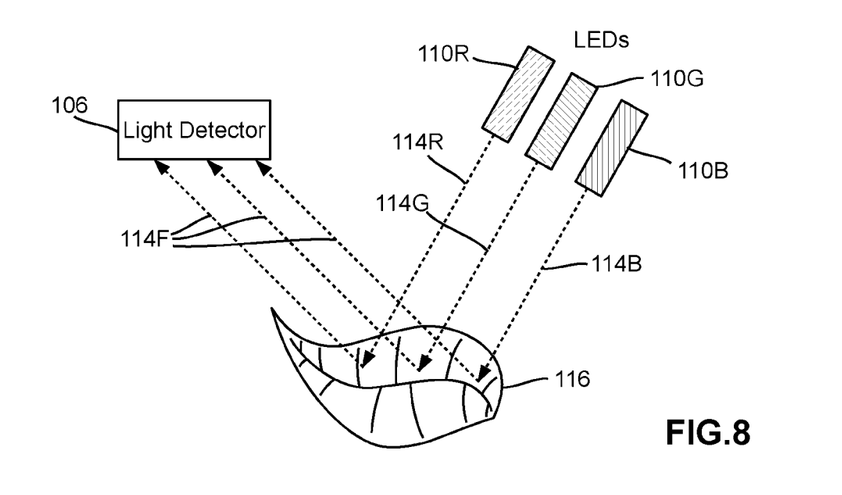
FIG. 8 illustrates how the light detector of the LED grow-light system shown in FIG. 3 receives the reflected light from the plant.

FIG. 8 illustrate how the light detector 106 receives the reflected light spectra 114F from the plant 116. In order to determine the plant growth condition, light spectra 114R, 114G, and 114B of various light spectra are emitted towards the plant 116 from LEDs 110R, 110G, and 110B. The light detector 106 detects the reflected light 114F. Based on the light spectra of the reflected light 114F, the plant identification sub-system 142 analyzes and determines the condition of the plant 116 such as the plant's growth, health, and the like.

Figure 9:
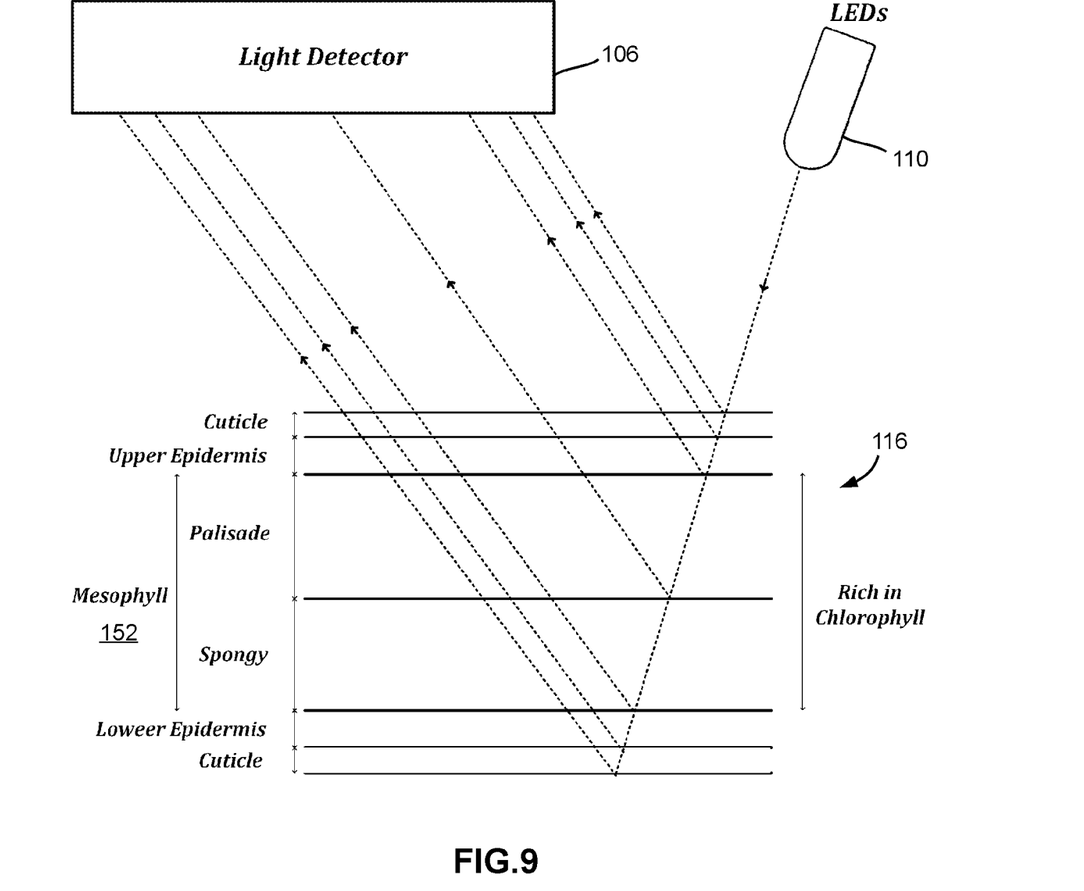
FIG. 9 shows a cross-section of a typical leaf of a plant, and how the LED grow-light system shown in FIG. 3 identifies the plant condition based on the reflected light.

FIG. 9 shows a cross-section of a typical leaf of a plant, and how the LED grow-light system 100 determines plant conditions based on the reflected light 114F. As shown, the mesophyll layer 152 is rich in chlorophyll, and chlorophyll is a good indication of the plant condition. Chlorophyll mostly absorbs the blue and red parts of the spectrum and reflects the green part. When the amount of chlorophyll is high, most of the red/blue parts are absorbed and most of the green spectrum is reflected. On the other hand, when chlorophyll dies or its quantity reduced, the mesophyll layer 152 reflects other parts of the spectrum as well. Thus, the plant condition can be quantified from the reflected light spectra detected by the light detector 106 of the LED grow-light driver 104.

In above embodiments, the LED grow-light system 100 comprises three LED arrays 108. In some alternative embodiments, the LED grow-light system 100 may only comprise one or two LED arrays 108. In some alternative embodiments, the LED grow-light system 100 may comprise more than LED arrays 108.

Figure 10:
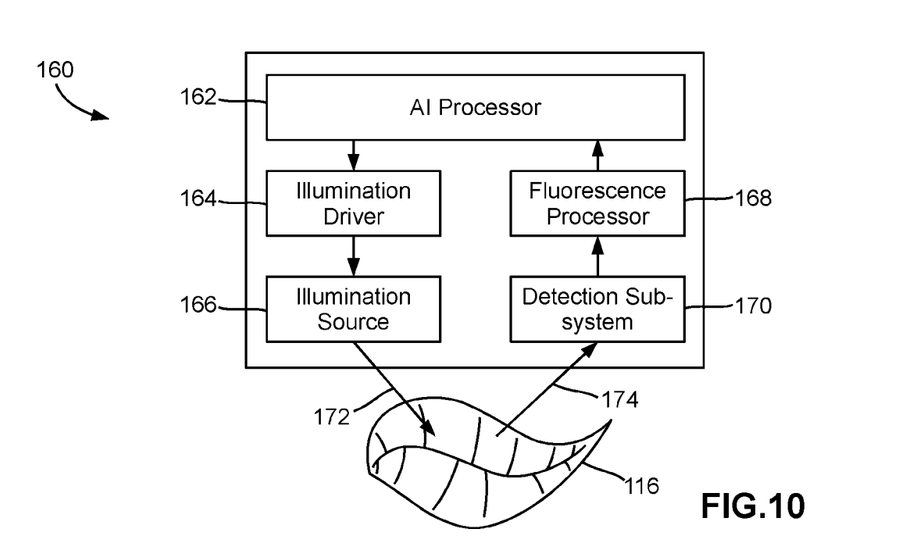
FIG. 10 is a schematic diagram of a LED grow-light system with illumination optimization, according to some embodiments of this disclosure.

FIG. 10 is a schematic diagram of a LED grow-light system 160 with illumination optimization, according to some embodiments of this disclosure.

As is known, photosynthesis efficiency strongly depends on the illumination condition. A similar illumination condition does not necessarily result in photosynthesis-efficient cultivation for all types of plants due to the different constituent photosynthesis organisms of the plants. Illumination condition includes a variety of parameters such as the light spectrum, intensity, geometry, duration, and the like. Therefore, the LED grow-light system 160 employs a learning process for determining an "illumination recipe" such as a set of illumination parameters that may lead to the most efficient photosynthesis rate. The LED grow-light system 160 uses an optimization algorithm for varying the illumination condition based on photosynthesis measurements for optimization of photosynthesis efficiency. In some embodiments, chlorophyll fluorescence measurements may be used to reliably estimate the photosynthesis efficiency and to generate inputs to the optimization algorithm.

As shown in FIG. 10, the LED grow-light system 160 comprises an artificial intelligent (AI) processor 162, an illumination driver 164, an illumination source 166, a fluorescence processor 168, and a detection device or subsystem 170.

The AI processor 162 in these embodiments is a computing device such as a general-purpose computer or a specialized computing device for receiving chlorophyll fluorescence measurements from the fluorescence processor 168, estimating the photosynthesis efficiency using the chlorophyll fluorescence measurements, determining a set of optimized illumination parameters for maximizing the photosynthesis efficiency, and controlling the illumination source 166 via the illumination driver 164 for adjusting the illumination light according to the determined illumination parameters.

The illumination source 166 in these embodiments comprises one or more LEDs and/or QLEDs, and is driven and controlled by the illumination driver 164 to emit light 172 to one or more plants 116 for facilitating their growth. A set of illumination parameters of the illumination source 166 are adjustable. For example, the light emitted from the illumination source 166 has an adjustable spectrum spanning from ultraviolet (UV) light through visible light to infrared (IR) light. The intensity distribution of the light emitted from the illumination source 166 over the spectrum thereof is also adjustable by for example, using pulsed light such as pulse-width-modulated light with adjustable pulse width.

The detection device 170 in these embodiments is an optical sensor for detecting fluorescence or light 174 emitted from the chlorophyll molecules of the plants 116 when the chlorophyll molecules are changed from an excited state to a non-excited state. The data of detected fluorescence is sent from the detection device 170 to the fluorescence processor 168.

The fluorescence processor 168 in these embodiments may be a specialized computing device such as an embedded computing device for processing the data of detected fluorescence to obtain chlorophyll fluorescence measurements which is sent to the AI processor 162 for optimizing the illumination parameters of the illumination source 166.

Figure 11:
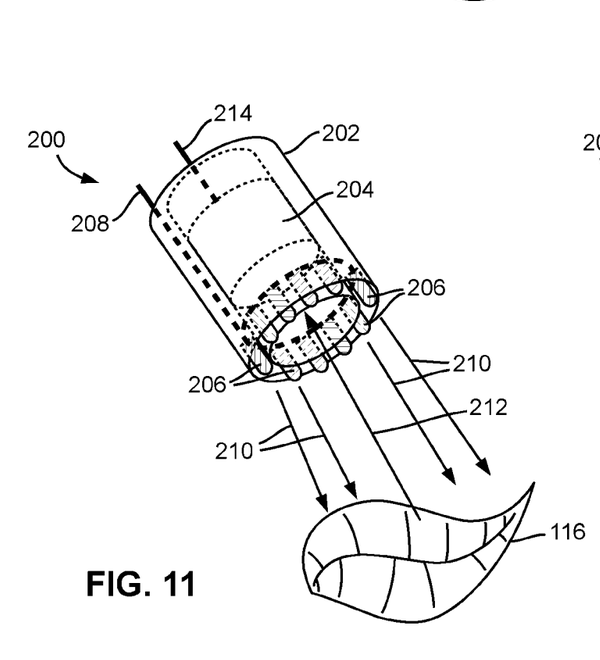
FIG. 11 is a schematic perspective view of a lighting and sensing device of the LED grow-light system shown in FIG. 10.
Figure 12:
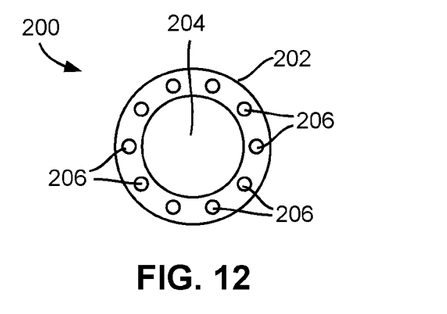
FIG. 12 is a schematic front view of the lighting and sensing device shown in FIG. 11.

In some embodiments, the illumination driver 164, the illumination source 166, and the detection device 170 may be assembled into a lighting and sensing device. FIG. 11 is a schematic perspective view of a lighting and sensing device 200. FIG. 12 is a schematic front view of the lighting and sensing device 200.

As shown in FIGS. 11 and 12, the lighting and sensing device 200 comprises a cylindrical housing 202 receiving therein a concentric optical sensor 204 and a plurality of LEDs 206 distributed in the annulus between the housing 202 and the optical sensor 204. In these embodiments, the LEDs 206 comprise one or more LEDs emitting ultraviolet (UV) spectra (denoted as UV LEDs), one or more LEDs emitting red, green, and/or blue spectra (denoted as R, G and/or B LEDs), and one or more LEDs emitting IR spectra (denoted as IR LEDs) for forming an adjustable spectrum spanning from UV spectra through visible spectra to IR spectra.

The LEDs 206 are connected to the illumination driver 164 via a drive cable 208 to receive a drive signal therefrom for powering and emitting light 210 towards one or more plants 116. The fluorescence 212 emitted from the plants 116 is detected by the optical sensor 204 and is converted to a detection signal for transmitting to the fluorescence processor 168 via a signal-output cable 214.

Figure 13:
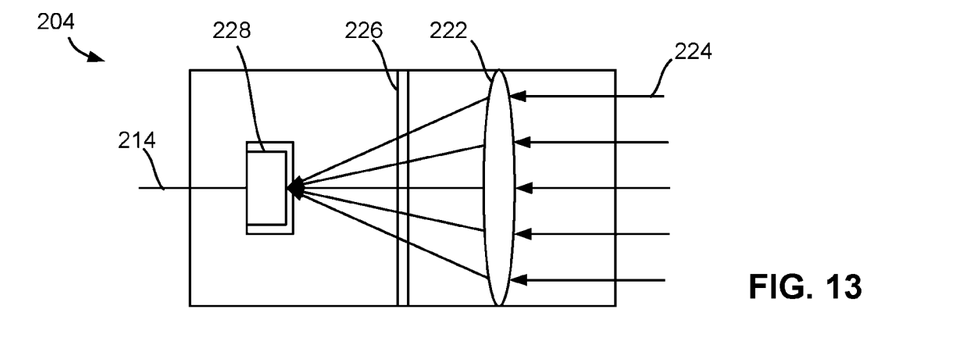
FIG. 13 is a schematic diagram illustrating the structure of the optical apparatus shown in FIG. 11.

As shown in FIG. 13, the optical sensor 204 comprises one or more lenses 222 for receiving light 224, an optical filter 226 for filtering the received light 224, and a photodetector or light sensor component 228 such as a complementary metal-oxide-semiconductor (CMOS) or charge-coupled device (CCD) light sensor component for converting the filtered light into an electrical signal for transmission via the signal-output cable 214.

Referring again to FIG. 10, the AI processor 162 controls the illumination source 166 to emit pulsed light 172 with adjustable intensity and spectrum for facilitating photosynthesis and the growth of the plants 116. By setting the LEDs 166 of different wavelengths on and off and by adjusting the pulse width of the light emitted from the turned-on LEDs 166 based on the output of the fluorescence processor 168 (described later), the AI processor 162 can optimize the illumination parameters such as the intensity and spectrum of the emitted light 172 for maximizing the photosynthesis efficiency of the plants 116.

As described above, the plants 116 absorbs the light 172 and uses it for photochemical processes. A portion of the absorbed light 172 is converted by the plant 116 into heat and fluorescence emission.

The detection device 170 detects the fluorescence emitted from the plants 116. The fluorescence processor 168 uses the fluorescence data obtained by the detection device 170 to determine chlorophyll fluorescence measurements, and sends the chlorophyll fluorescence measurements to the AI processor 162. The AI processor 162 then estimates the photosynthesis efficiency. The detail of estimating the photosynthesis efficiency is disclosed in References 7 to 9, the content of each of which is incorporated herein by reference in its entirety. After estimating the photosynthesis efficiency, the AI processor 162 determines a set of optimized values for the set of adjustable illumination parameters for maximizing the photosynthesis efficiency, and adjusts the illumination parameters of the illumination source 166 such as the intensity and spectrum of the emitted light 172 using the set of optimized values.

In some embodiments, the AI processor 162 uses a simulated annealing method for optimizing the set of illumination parameters to maximize the photosynthesis efficiency of the plants 116. In this process, a plurality of states of illumination $S_k$ are defined for the photosynthesis of the plants 116. Each state of illumination $S_k$ corresponds to a set of illumination parameters which determine a photosynthesis efficiency of the plants 116.

The process starts with a random state of illumination $S_r$ that has continued for a sufficient period of time such that photosynthesis becomes fully established. Then, the photosynthesis efficiency $E_{n+1}$ is calculated using chlorophyll fluorescence measurements obtained from the fluorescence processor 206. The process is repeated with new illumination state varied from the previous state by a random change $\Delta S$, and the photosynthesis efficiency corresponding to the new state is calculated and compared to that of previous states until a maximum photosynthesis efficiency is reached.

Such a maximum photosynthesis efficiency may be a local maximum. Therefore, the process is designed to explore the optimization space again to avoid being trapped at a local maximum. The transition from the current state to a new state is made according to an acceptance probability function $\exp(-\Delta E_n/T)$ that depends on the difference of the photosynthesis efficiency of the states and a global time-varying parameter T, wherein exp( ) represents the exponential function and $\Delta E_n = E_n - E_{n-1}$.

As the process progresses, the parameter T reduces from a large initial value to zero at the final stage of the optimization. In particular, T is set to large values at the initial iterations of the process such that the process can explore a variety of regions in the search space. At the final iterations, T tends to zero (0) and the acceptance probability function tends to one (1), thereby turning the process to the "greedy algorithm" which makes only uphill transitions. With a suitable choice of parameters, the process may find the global maximum.

Figure 14:
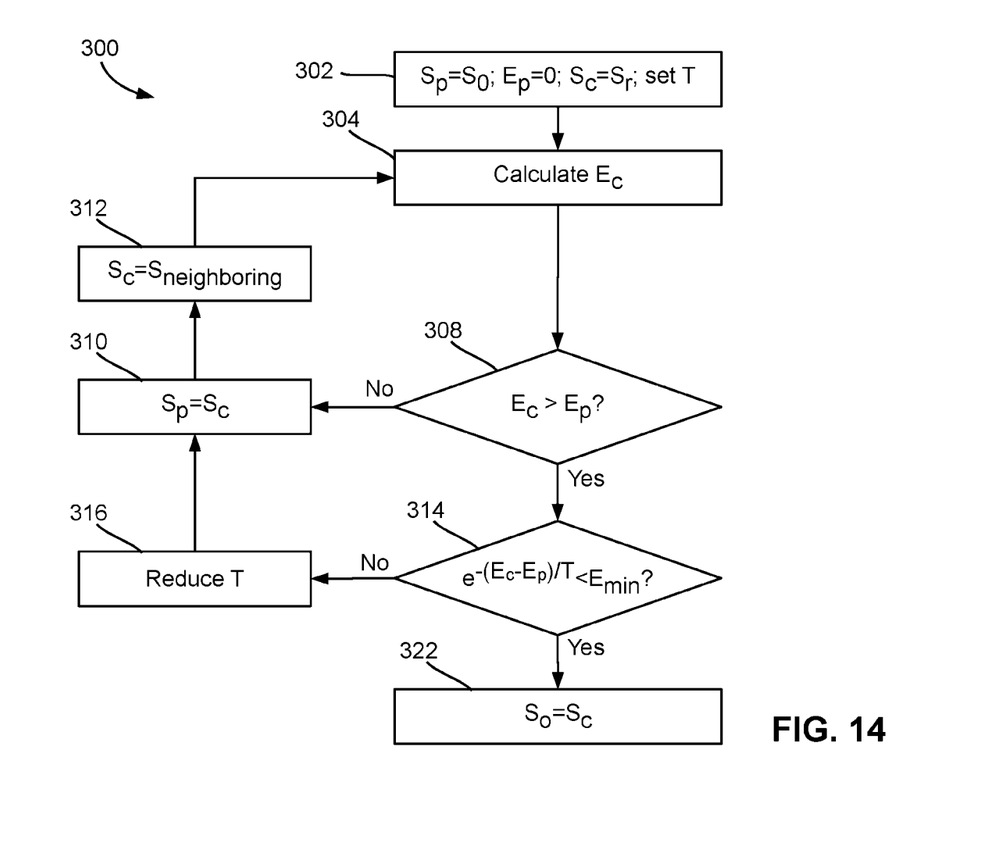
FIG. 14 is a flowchart of an illumination optimization process of the LED grow-light system shown in FIG. 10.

FIG. 14 is a flowchart showing the steps of an example of the above-described optimization process 300 based on the simulated annealing method. As shown, the process 300 starts with an initialization step 302 at which the AI processor 162 sets a previous-state variable $S_p$ to an initial state $S_0$ and the corresponding previous-state photosynthesis efficiency $E_p$ to zero. The AI processor 162 also sets a global time-varying parameter T (also called "temperature") to an initial value, and sets a current-state variable $S_c$ to a random state of illumination $S_r$ that has continued for a sufficient period of time such that photosynthesis becomes fully established. The process 300 then starts the optimization process from the random state $S_r$.

At step 304, the AI processor 162 calculates a current-state photosynthesis efficiency $E_c$ of the plants 116 at the current state $S_c$ using the chlorophyll fluorescence measurements obtained from the fluorescence processor 168. Then, the AI processor 162 compares the current-state photosynthesis efficiency $E_c$ with the previous-state photosynthesis efficiency $E_p$ (step 308).

If the current-state photosynthesis efficiency $E_c$ is not greater than the previous-state photosynthesis efficiency $E_p$ (the "NO" branch of step 308), the AI processor 162 sets the previous state $S_p$ as the current state of illumination $S_c$ (step 310) and updates the current state $S_c$ to a neighboring state from $S_c$ by a random change $\Delta S$ (step 312). The process 300 then loops back to step 304 to calculate the current-state photosynthesis efficiency $E_c$ of the plants 116.

If at step 308, it is determined that the current-state photosynthesis efficiency $E_c$ is greater than the previous-state photosynthesis efficiency $E_p$ (the "YES" branch of step 308), then the AI processor 162 further calculates an acceptance probability function $\exp(-(E_c-E_p)/T)$ and checks if the acceptance probability function $\exp(-(E_c-E_p)/T)$ is smaller than a predetermined threshold $E_{min}$ (step 314).

If the acceptance probability function $\exp(-(E_c-E_p)/T)$ is larger than or equal to the predetermined threshold $E_{min}$ (the "NO" branch of step 314), the AI processor 162 reduces the temperature T (step 316), and the process 300 loops back to step 310 to update the previous state $S_p$ and the current state $S_c$.

If at step 314, it is determined that the acceptance probability function $\exp(-(E_c-E_p)/T)$ is smaller than the predetermined threshold $E_{min}$ (the "YES" branch of step 314), the current state $S_c$ is considered the optimal state $S_o$ and the set of illumination parameters corresponding to the optimal state $S_o$ are used for adjusting the settings of the illumination source 166 (step 322).

Those skilled in the art will appreciate that in some alternative embodiments, other suitable optimization methods such as genetic algorithms may be used for optimizing illumination parameters to maximize the photosynthesis efficiency of the plants 116.

Although embodiments have been described above with reference to the accompanying drawings, those of skill in the art will appreciate that variations and modifications may be made without departing from the scope thereof as defined by the appended claims.

REFERENCES

1. Academic paper entitled "The Action Spectrum, Absorptance and Quantum Yield of Photosynthesis in Crop Plants" by K. J. McCree, published in Agricultural Meteorology, volume 9, 1971-1972, pages 191-216.
2. Academic paper entitled "Influence of Green, Red, and Blue Light Emitting Diodes on Multiprotein Complex Protein and Photosynthesis Activity under Different Light Intensities in Lettuce Leaves" by Sowbiya Muneer, Eun Jeong Kim, Jeong Suk Park, and Jeong Hyun Lee, published in International Journal of Molecular Sciences, volume 15, issue 3, pages 4657-4670, March 2014.
3. Online article entitled "The Effects of LEDS on Plants" published on Dec. 1, 2016 by Maximum Yield (https://www.maximumyield.com/the-effects-of-leds-on-plants/2/1332).
4. Academic paper entitled "A Novel Approach of LED Light Radiation Improves the Antioxidant Activity of Pea Seedlings" by Ming-Chang Wu, Chi-Yao Hou, Chii-Ming Jiang, Yuh-Tai Wang, Chih-Yu Wang, Ho-Hsien Chen, and Hung-Min Chang, published in Food Chemistry, volume 101, issue 4, 2007, pages 1753-1758.
5. Academic paper entitled "Combined Effects of Light Intensity, Light Path and Culture Density on Output Rate of Spirulina Platensis (Cyanobacteria)" by Hu Qiang, Yair Zarmi, and Amos Richmond, published in European Journal of Phycology, volume 33, issue 2, 1998, pages 165-171.
6. Academic paper entitled "Root-Shoot Interaction in the Greening of Wheat Seedlings Grown under Red Light" by B. C. Tripathy and C. S. Brown, published in Plant Physiology, volume 107, issue 2, 1995, pages 407-411.
7. Chapter 1, "Chlorophyll a Fluorescence: A Bit of Basics and History" by Govindjee, in book entitled "Chlorophyll a Fluorescence, A Signature of Photosynthesis", Editors: G. C. Papageorgiou and Govindjee, published by Springer, Dordrecht, 2004, pages 1-42.
8. Book chapter entitled "Estimating Aquatic productivity from active fluorescence measurements" by David J. Suggett, C. Mark Moore, and Richard J. Geider, in the book entitled "Chlorophyll a Fluorescence in Aquatic Sciences: Methods and Applications", by Springer, Dordrecht, 2010, pages 103-127, of book series "Developments in Applied Phycology", volume 4.
9. Academic paper entitled "Chlorophyll Fluorescence Analysis: a Guide to Good Practice and Understanding Some New Applications" by Erik Murchie and Tracy Lawson, published in Journal of Experimental Botany, volume 64, issue 13, 2013, pages 3983-3998.
10. U.S. Pat. No. 8,302,346, entitled "Biological Optimization Systems for Enhancing Photosynthetic Efficiency and Methods of Use" to Ryan W. Hunt, Senthil Chinnasamy, Keshav C. Das, and Erico Rolim De Mattos, issued on Nov. 6, 2012.

11. Academic paper entitled "Optimization of the Theoretical Photosynthesis Performance and Vision-Friendly Quality of Multi-Package Purplish White LED Lighting", by Ji Hye Oh, Heejoon Kang, Hoo Keun Park, and Young Rag Do, published in RSC Advances, volume 5, issue 28, 2015, pages 21745-21754.

12. Academic paper entitled "Optimizing Photosynthesis under Fluctuating Light", by Paolo Pesaresi, Alexander Hertle, Mathias Pribil, Anja Schneider, Tatjana Kleine, and Dario Leister, published in Plant Signaling & Behavior, volume 5, issue 1, 2010, pages 21-25.

The invention claimed is:

1. A lighting system for facilitating the growth of a plant, the system comprising:
   an illumination source for emitting a first light absorbable by the plant, said first light having a spectrum and a set of adjustable illumination parameters;
   at least one light detector for detecting a second light from the plant, said the second light comprising a chlorophyll fluorescence emitted from the plant; and
   a control structure coupled to the illumination source and the at least one light detector, the control structure being configured for:
   receiving from the at least one light detector, a signal indicative of the detected second light;
   determining a growth condition of the plant based on the received signal;
   determining a set of values for the set of adjustable illumination parameters based on the determined growth condition; and
   controlling the illumination source to adjust the set of adjustable illumination parameters using the set of determined values for facilitating the growth of the plant;
   wherein the growth condition is a photosynthesis efficiency of the plant under the first light; and
   wherein said determining the set of values for the set of adjustable illumination parameters based on the determined growth condition comprises:
   determining the set of values for the set of adjustable illumination parameters for maximizing the photosynthesis efficiency by using a simulated annealing method or a genetic algorithm.

2. The lighting system of claim 1, wherein the set of adjustable illumination parameters comprise at least one of the spectrum of the first light, and an intensity distribution of the first light over the spectrum.

3. The lighting system of claim 2, wherein the spectrum is a spectrum spanning from an ultraviolet (UV) wavelength through a visible wavelength range to an infrared (IR) wavelength.

4. The lighting system of claim 2, wherein the spectrum comprises a combination of a red-light wavelength range, a green-light wavelength range, and a blue-light wavelength range.

5. The lighting system of claim 2, wherein the set of adjustable illumination parameters further comprise at least one of a distance and an angle between the illumination source and the plant.

6. The lighting system of claim 5 further comprising:
   at least one motor engaging the illumination source;
   wherein said determining the set of values for the set of adjustable illumination parameters based on the determined growth condition comprises determining at least one of a distance value and an angle value between the illumination source and the plant; and
   wherein said controlling the illumination source to adjust the set of adjustable illumination parameters using the set of determined values comprises controlling the at least one motor to adjust the at least one of the distance and the angle using the at least one of the distance value and the angle value.

7. The lighting system of claim 1 wherein said determining the growth condition of the plant based on the received signal comprises determining chlorophyll fluorescence measurements based on the received signal; and
   wherein said determining the set of values for the set of adjustable illumination parameters for maximizing the photosynthesis efficiency by using a simulated annealing method or a genetic algorithm comprises:
   (1) defining a plurality of states of illumination each corresponding to a set of values for the set of illumination parameters that determine the photosynthesis efficiency of the plant;
   (2) setting (i) a previous-state variable $S_p$ to an initial state of illumination $S_0$, (ii) a corresponding previous-state photosynthesis efficiency $E_p$ to zero, (iii) a global time-varying parameter T to an initial value, and (iv) a current-state variable $S_c$ to a random state $S_r$ of the plurality of states of illumination that has continued for a period of time such that photosynthesis is established;
   (3) calculating a current-state photosynthesis efficiency $E_c$ of the plant at the current state $S_c$ using the determined chlorophyll fluorescence measurements;
   (4) comparing the current-state photosynthesis efficiency $E_c$ with the previous-state photosynthesis efficiency $E_p$;
   if the current-state photosynthesis efficiency $E_c$ is less than or equal to the previous-state photosynthesis efficiency $E_p$, (5) setting the previous state $S_p$ as the current state of illumination $S_c$ and updating the current state $S_c$ to a neighboring state from $S_c$ by a random change $\Delta S$, and looping to step (3);
   if the current-state photosynthesis efficiency $E_c$ is greater than the previous-state photosynthesis efficiency $E_p$, (6) calculating an acceptance probability function $\exp(-(E_c-E_p)/T)$ and checking if the acceptance probability function $\exp(-(E_c-E_p)/T)$ is smaller than a predetermined threshold $E_{min}$;
   if the acceptance probability function $\exp(-(E_c-E_p)/T)$ is larger than or equal to the predetermined threshold $E_{min}$, (7) reducing the parameter T and looping to step (5); and
   if the acceptance probability function $\exp(-(E_c-E_p)/T)$ is smaller than the predetermined threshold $E_{min}$, (8) determining the set of values for the set of adjustable illumination parameters as the set of illumination parameters corresponding to the state $S_c$.

8. The lighting system of claim 1, wherein the illumination source comprises a plurality sets of LEDs for emitting the first light.

9. The lighting system of claim 8, wherein the plurality sets of LEDs comprises one or more quantum-dot LEDs.

10. The lighting system of claim 8, wherein said controlling the illumination source to adjust the set of adjustable illumination parameters using the set of determined values for facilitating the growth of the plant comprises:
    adjusting at least one of a distance and an angle of each sets of LEDs to the plant.

11. The lighting system of claim 8, wherein each set of LEDs comprises:
    one or more subsets of LEDs, each subset of LEDs configured for emitting a colored light, said colored light being a portion of the first light having a subset of the spectrum of the first light; and one or more switching components each controlling one subset of LEDs.

12. The lighting system of claim 11, wherein each of the one or more switching components is configured for controlling the corresponding subset of LEDs for emitting pulsed light as the portion of the first light.

13. The lighting system of claim 12, wherein the first light is a pulse-width modulated light.

14. The lighting system of claim 12, wherein said determining the set of values for the set of adjustable illumination parameters based on the determined growth condition comprises determining settings of each of the one or more switching components based on the determined growth condition; and wherein said controlling the illumination source to adjust the set of adjustable illumination parameters using the set of determined values for facilitating the growth of the plant comprises controlling the switching components based on the determined settings to adjust at least one of the spectrum of the first light and an intensity of the first light over the spectrum thereof.

15. The lighting system of claim 8 further comprising at least one lighting and sensing device, each lighting and sensing device comprising:

a housing;

one of the at least one light detector received in the housing; and a group of the LEDs distributed in an annulus between the housing and said one of the at least one light detector.

16. The lighting system of claim 1, wherein the at least one light detector comprises at least a lens, a light filter, and a light-sensing component.

17. A method for facilitating the growth of a plant, the method comprising:

emitting a first light from an illumination source towards the plant, said first light having a spectrum absorbable by the plant and a set of adjustable illumination parameters;

detecting a second light from the plant, the second light being a chlorophyll fluorescence emitted from the plant;

determining a growth condition of the plant based on the detected second light;

determining a set of values for the set of adjustable illumination parameters based on the determined growth condition; and controlling the illumination source to adjust the set of adjustable illumination parameters using the set of determined values for facilitating the growth of the plant;

wherein the growth condition is a photosynthesis efficiency of the plant under the first light; and wherein said determining the set of values for the set of adjustable illumination parameters based on the determined growth condition comprises:

determining the set of values for the set of adjustable illumination parameters for maximizing the photosynthesis efficiency by using a simulated annealing method or a genetic algorithm.

18. The method of claim 17, wherein the set of adjustable illumination parameters comprise at least one of the spectrum of the first light, and an intensity distribution of the first light over the spectrum.

19. The method of claim 18, wherein the spectrum is a spectrum spanning from an ultraviolet (UV) wavelength through a visible wavelength range to an infrared (IR) wavelength.

20. The method of claim 18, wherein the spectrum comprises a combination of a red-light wavelength range, a green-light wavelength range, and a blue-light wavelength range.

21. The method of claim 18, wherein the set of adjustable illumination parameters further comprise at least one of a distance and an angle between the illumination source and the plant.

22. The method of claim 21, wherein said determining the set of values for the set of adjustable illumination parameters based on the determined growth condition comprises determining at least one of a distance value and an angle value between the illumination source and the plant; and wherein said controlling the illumination source to adjust the set of adjustable illumination parameters using the set of determined values comprises adjusting the at least one of the distance and the angle using the at least one of the distance value and the angle value.

23. The method of claim 17 wherein said determining the growth condition of the plant based on the received signal comprises determining chlorophyll fluorescence measurements based on the received signal; and wherein said determining the set of values for the set of adjustable illumination parameters for maximizing the photosynthesis efficiency by using a simulated annealing method or a genetic algorithm comprises:

(1) defining a plurality of states of illumination each corresponding to a set of values for the set of illumination parameters that determine the photosynthesis efficiency of the plant;

(2) setting (i) a previous-state variable $S_p$ to an initial state of illumination $S_0$, (ii) a corresponding previous-state photosynthesis efficiency $E_p$ to zero, (iii) a global time-varying parameter T to an initial value, and (iv) a current-state variable $S_c$ to a random state $S_r$ of the plurality of states of illumination that has continued for a period of time such that photosynthesis is established;

(3) calculating a current-state photosynthesis efficiency $E_c$ of the plant at the current state $S_c$ using the determined chlorophyll fluorescence measurements;

(4) comparing the current-state photosynthesis efficiency $E_c$ with the previous-state photosynthesis efficiency $E_p$;

if the current-state photosynthesis efficiency $E_c$ is less than or equal to the previous-state photosynthesis efficiency $E_p$, (5) setting the previous state $S_p$ as the current state of illumination $S_c$ and updating the current state $S_c$ to a neighboring state from $S_c$ by a random change $\Delta S$, and looping to step (3);

if the current-state photosynthesis efficiency $E_c$ is greater than the previous-state photosynthesis efficiency $E_p$, (6) calculating an acceptance probability function $\exp(-(E_c-E_p)/T)$ and checking if the acceptance probability function $\exp(-(E_c-E_p)/T)$ is smaller than a predetermined threshold $E_{min}$;

if the acceptance probability function $\exp(-(E_c-E_p)/T)$ is larger than or equal to the predetermined threshold $E_{min}$, (7) reducing the parameter T and looping to step (5); and if the acceptance probability function $\exp(-(E_c-E_p)/T)$ is smaller than the predetermined threshold $E_{min}$, (8) determining the set of values for the set of adjustable illumination parameters as the set of illumination parameters corresponding to the state $S_c$.

24. The method of claim 17, wherein the illumination source comprises a plurality sets of LEDs for emitting the first light, each set of LEDs comprises one or more subsets of LEDs, each subset of LEDs configured for emitting a colored light, said colored light being a portion of the first light having a subset of the spectrum of the first light; and wherein said controlling the illumination source to adjust the set of adjustable illumination parameters using the set of determined values for facilitating the growth of the plant comprises:

controlling settings of each subset of LEDs to adjust at least one of the spectrum of the first light and an intensity of the first light over the spectrum thereof.

25. The method of claim 24, wherein said controlling the illumination source to adjust the set of adjustable illumination parameters using the set of determined values for facilitating the growth of the plant comprises:

adjusting at least one of a distance and an angle of each sets of LEDs to the plant.

* * * * *